United States Patent [19]
Lee et al.

[11] Patent Number: 5,572,158
[45] Date of Patent: Nov. 5, 1996

[54] AMPLIFIER WITH ACTIVE DUTY CYCLE CORRECTION

[75] Inventors: Thomas H. Lee, Cupertino; Kevin S. Donnelly, San Francisco; Tsyr-Chyang Ho, San Jose, all of Calif.

[73] Assignee: Rambus, Inc., Mountain View, Calif.

[21] Appl. No.: 548,900

[22] Filed: Sep. 18, 1995

Related U.S. Application Data

[63] Continuation of Ser. No. 196,711, Feb. 15, 1994, abandoned.

[51] Int. Cl.$^6$ ................................................. H03K 3/017
[52] U.S. Cl. ......................... 327/175; 327/170; 327/309; 327/536; 327/563
[58] Field of Search .................................. 327/170, 172, 327/175, 178, 180, 291, 292, 295, 306, 309, 318, 331, 332, 560, 561, 562, 563, 35

[56] References Cited

U.S. PATENT DOCUMENTS

| | | | |
|---|---|---|---|
| 4,644,196 | 2/1987 | Flannagan | 307/530 |
| 4,724,337 | 2/1988 | Maeda et al. | 307/262 |
| 4,789,799 | 12/1988 | Taylor et al. | 307/542 |
| 4,992,757 | 2/1991 | Shin'e | 307/562 |
| 5,182,476 | 1/1993 | Hanna et al. | 307/491 |

FOREIGN PATENT DOCUMENTS

| | | |
|---|---|---|
| A0343899 | 11/1989 | European Pat. Off. . |
| A0398751 | 11/1990 | European Pat. Off. . |
| A3816973 | 12/1988 | Germany . |
| A4018615 | 12/1990 | Germany . |

OTHER PUBLICATIONS

Patent Abstract of Japan–vol. 16, No. 158 (E–1191), 17 Apr. 1992 & JPA04010810 (Sharp Corp) 16 Jan. 1992.

Patent Abstract of Japan–vol. 11, No. 73 (E–486), 5 Mar. 1987 & JPA61228720 (Hitachi Cable Ltd) 11 Oct. 1986.

*Primary Examiner*—Timothy P. Callahan
*Assistant Examiner*—T. Lam
*Attorney, Agent, or Firm*—Blakely, Sokoloff, Taylor & Zafman

[57] ABSTRACT

A circuit is provided which actively corrects the duty cycle of a periodic signal such as a clock signal. The amplifier circuit includes a duty cycle error measurement circuit which measures the error of the output signal from a predetermined duty cycle, for example, 50% duty cycle. A correcting signal is generated from the error signal output by the duty cycle error measurement circuit. The correcting signal is combined with the uncorrected input signal to the circuit to function to offset the signal in order to correct the duty cycle, the combined signals are input to an integrating capacitance to generate a slew limited signal. By varying the amount of the correcting signal and therefore the symmetry of the slew limited signal, the duty cycle of the output can be varied to generate a signal with the desired duty cycle.

21 Claims, 4 Drawing Sheets

AMPLIFIER WITH ACTIVE DUTY CYCLE CORRECTION

This is a continuation of application Ser. No. 08/196,711, filed Feb. 15, 1994, now abandoned.

BACKGROUND OF THE INVENTION

1. Field of the Invention

The present invention relates to an amplifier that receives periodic input signals with imperfect duty cycle and produces periodic output signals with substantially 50% duty cycle.

2. Art Background

In many applications it is desirable to generate, amplify and distribute periodic signals, such as clock signals, while maintaining a 50% duty cycle. However, most signal sources, for example, tuned and relaxation oscillators, do not generate signals with perfect duty cycle.

SUMMARY OF THE INVENTION

It is an object of the present invention to provide an amplifier circuit that generates as output periodic signals with a 50% duty cycle.

It is an object of the present invention to provide a circuit for correcting the duty cycle of periodic signals.

The circuit receives periodic input signals that possess an imperfect duty cycle, and outputs periodic output signals with a corrected duty cycle through the use of active duty cycle correction. The circuit receives the uncorrected periodic input signal and generates an intermediate signal current reflective of the uncorrected input signal. The intermediate signal current is summed with a correction current which offsets the signal current. The summed current is input to an integrating capacitance. The voltage across the integrating capacitance is clamped to a finite value. The capacitance and clamping voltage are chosen so that the voltage across the capacitor ramps substantially linearly (i.e., slew limits) over a substantial fraction of the period of the input signal. The slew-limited, clamped capacitor voltage signal then drives an amplifier that regenerates a substantially square waveform as output. By varying the amount of the correction current, an uncorrected input signal having a non-linear ramp input (e.g., the rising edge and falling edge of the signal being substantially unequal) can be modified to have a linear input and the duty cycle of the regenerated waveform can be varied over a range constrained mainly by the fraction of the period that is dominated by the slewing process.

The correction current is determined from a duty cycle measurement circuit which receives as input the output signal to be corrected. The error measurement is preferably performed using, a differential charge pump driven by the signal to be corrected. The output of the charge pump is proportional to the time integral of the departure of the signal output from the 50% duty cycle condition.

BRIEF DESCRIPTION OF THE DRAWINGS

The objects, features and advantages of the present invention will be apparent to one skilled in the art from the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
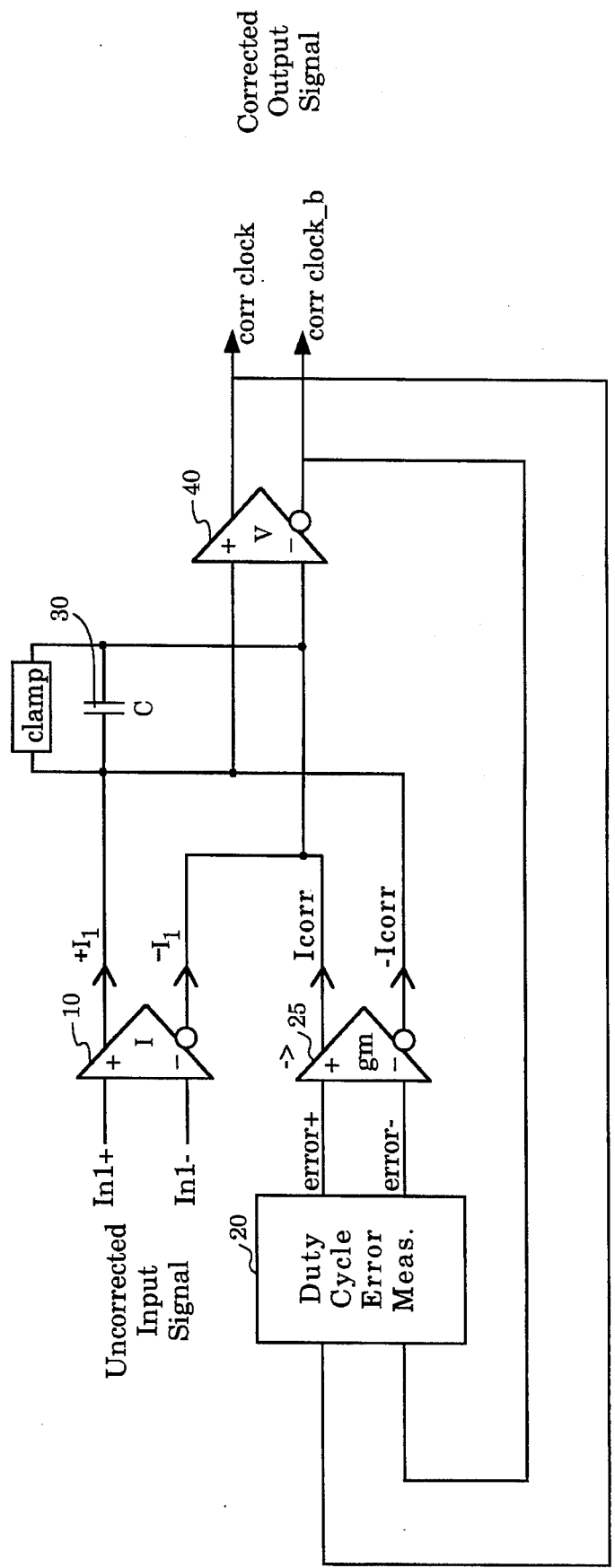
FIG. 1 is a block diagram of one embodiment of the amplifier with active duty cycle correction of the present invention.

FIG. 1 illustrates a simplified block diagram of the duty cycle correcting circuit of the present invention. An input amplifier 10, such as an operational transconductance amplifier (OTA), receives a differential input of the input signal, for example, a periodic clock signal, and generates a differential output current. The amplifier 10 functions substantially as a current switch so that the differential output is approximately $I_1$ or $-I_1$, depending upon the polarity of the input signal. Each output current of amplifier 10 is then summed with a current correcting signal Icorr. Icorr is preferably a DC or substantially low frequency current signal which functions to offset the output current from the amplifier 10. Therefore, the total sum differential current is Icorr $+I_1$ or Icorr $-I_1$, depending upon the polarity of the input signal.

The summed differential currents are then fed into an integrating capacitance 30 in order to generate a slew limited, clamped voltage signal as output. The voltage across the integrating capacitance is arranged to have a finite maximum value, so that the capacitor voltage is clamped as well as slew-limited. When the output voltage is slew-limited, the output voltage swing (i.e., rise time) is equal to some determined maximum rate which is a percentage of the period of the signal. The capacitance value is chosen to be large enough in relation to the potential current values and clamping voltage such that the voltage waveform across the capacitor exhibits substactical slew-limiting for a fraction of the input signal period greater than the desired duty cycle correction range. The capacitance may be inherent in the physical structure of transistors used in the circuit or a separate capacitive component within the circuit may be used. The clamping of the capacitor voltage may be accomplished either implicitly by the inherently finite voltage swings of the circuitry employed, or explicitly through other means that are well known to the art, such as use of diode clamps or resistors.

The addition of a non-zero value of Icorr forces the slewing of the edges of the source signal to be asymmetrical since the correction current increases one edge speed while decreasing the other edge speed. By varying the amount of Icorr and therefore the symmetry of the slew-limited, clamped signal, the rising and/or falling edges of and therefore the duty cycle of the corrected output signal can be varied over a range constrained primarily by the fraction of a period that is dominated by slewing. Therefore, it can be seen that large amounts of correction require large amounts of slewing. However, the slew limiting process is limited by the period of the signal (due to the slope of the rise time and fall time of the signal). The fraction of the period dominated by slewing can not be so great that that signal does not reach the peak, clamped, signal value as the entire period of the signal is composed of the rising edge and falling edge of the signal.

The voltage across capacitance 30 is then input to an amplifier 40 that functions to generate a substantially square waveform as the corrected output signal.

The correction current Icorr is generated by a duty cycle error measurement circuit 20 and transconductance amplifier 25. Preferably, the duty cycle error measurement circuit consists of a differential charge pump driven by the differential output whose duty cycle is to be corrected. The output of the charge pump is proportional to the time integral of the departure of the clock signal output from a predetermined duty cycle condition, such as a 50% duty cycle.

The transfer function of the error measurement circuit 20 may also include extra poles, intentionally placed to provide additional filtering of ripple to minimize jitter added to the final clock output. These poles must be located at a frequency high enough to avoid destabilizing the duty cycle correction loop. The avoidance of instability is well known in the art of feedback system design.

Figure 2:
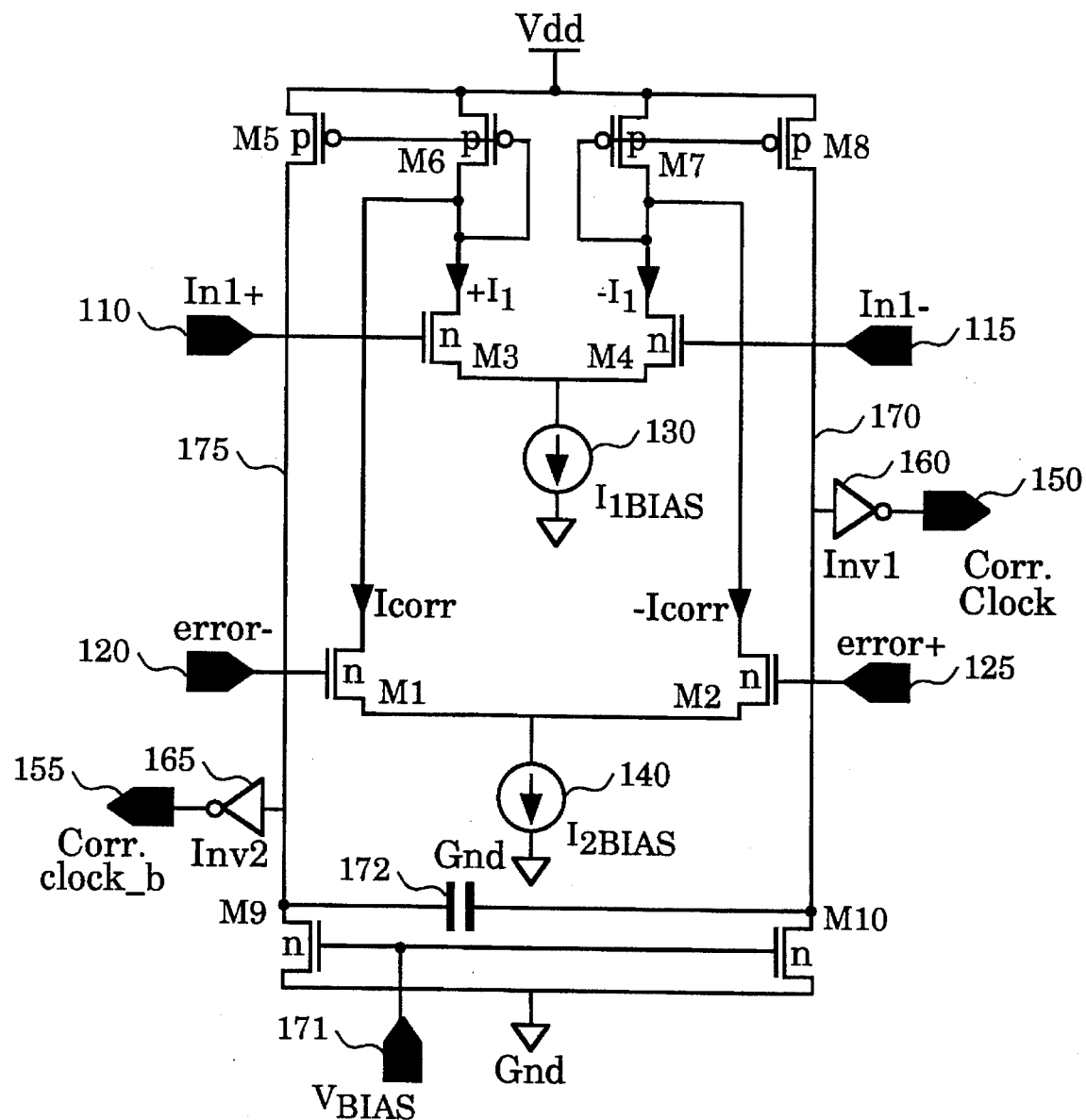
FIG. 2 is an illustration of an embodiment of a correcting amplifier utilized in the circuit of the present invention.
Figure 3A:
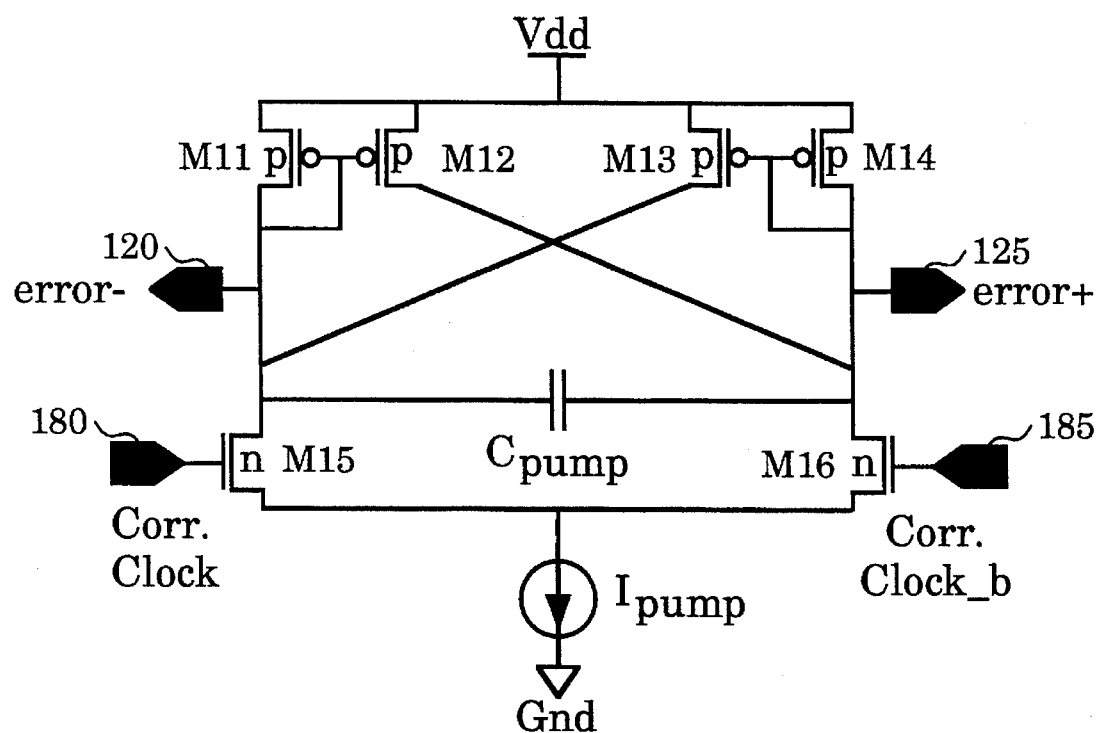
FIGS. 3a and 3b respectively illustrate embodiments of the error measurement circuit and circuit to generate input to the error measurement circuit utilized in the amplifier of the present invention.

FIG. 2 is a simplified circuit diagram of one embodiment of the correcting amplifier of the present invention. The amplifier receives as input the uncorrected input signal $IN_1+$ 110 and $IN_1-$ 115 and the error values, error+125, error−120. The error signals are generated by the duty cycle error measurement circuit, an embodiment of which is illustrated by FIG. 3a. The output of the circuit is the corrected differential clock signal 150, 155.

Referring to FIG. 2, the amplifier consists of two operational transconductance amplifiers (OTAs) connected in parallel. The uncorrected clock signal input 110, 115, drives transistor pair M3, M4. The gain of transistors M3 and M4 are made sufficiently high so that substantially all of the bias current $I_{1BIAS}$ 130 flows alternately through transistors M3 and M4, depending upon the polarity of the input signal. The duty cycle error signal 120, 125, generated by the duty cycle error measurement circuit, drives transistor pair M1 and M2. The output current generated is then added to the current generated by transistors M3 and M4. Inverters Inv1 and Inv2 160, 165 are preferably ideal infinite gain inverters such that the output of the inverter changes state when a predetermined threshold value is crossed thus helping in the formation of the square wave output.

The outputs of the OTAs are the common drain connection of transistors M8 and M10, node 170, and the common drain connection of transistors M5 and M9, node 175. Preferably the bias currents $I_{1BIAS}$, $I_{2BIAS}$, 130, 140 are chosen in combination with the capacitance associated with the common drain connection and clamping voltage (in the present embodiment, the clamping voltage is substantially equal to the power supply voltage VDD) to provide the desired slew limiting characteristics to correct the duty cycle of the input signal. Alternately, a separate capacitance component may be utilized to provide the integrating capacitance functionality. For example, a capacitor such as capacitor 172, may be used. Furthermore, other considerations, such as noise and/or jitter performance, may dictate the greater operating current or explicit additional capacitance connected to the OTA outputs 170, 175. Therefore, an explicit additional capacitance would then be connected to the OTA outputs 170, 175 to provide the necessary slew limiting characteristics. For example a capacitor may be connected between nodes 170 and 175, the drain nodes of transistors M9 and M10. Alternately, separate capacitor components may be connected between node 170 and ground and node 175 and ground. In addition, a resistor can optionally be coupled across the capacitor to provide signal clamping at a voltage equal to $I_{2BIAS}*R$.

FIG. 3a illustrates one embodiment of the duty cycle error measurement circuit utilized in the amplifier of the present invention. It is apparent to one skilled in the art that other circuits may be used to generate the correcting correct value Icorr. Referring to FIG. 3a, a differential charge pump is utilized. Transistors M11–M14 together comprise a load element having a differential impedance of an extremely high value but having further a common mode resistance that is extremely low. Therefore, no common mode feedback is necessary to fix the output common mode voltage.

The output of the charge pump circuit is differential error signals 120, 125. Input to the charge pump circuit is the corrected clock signal 180 and a second corrected clock signal 185 substantially 180 degrees out of phase with the initial corrected clock signal. These complementary input signals drive the charge pump circuit which provides an output 120, 125 proportional to the time integral of the departure of the duty cycle of the signal from a 50% duty cycle.

In the embodiment shown in FIG. 2, signals 180, 185 (FIG. 3a) are generated in the circuit (signals 150, 155). A voltage bias 171, is chosen such that the current through transistors M9 and M10 is nominally ½ $(I_{1BIAS}+I_{2BIAS})$.

Figure 3B:
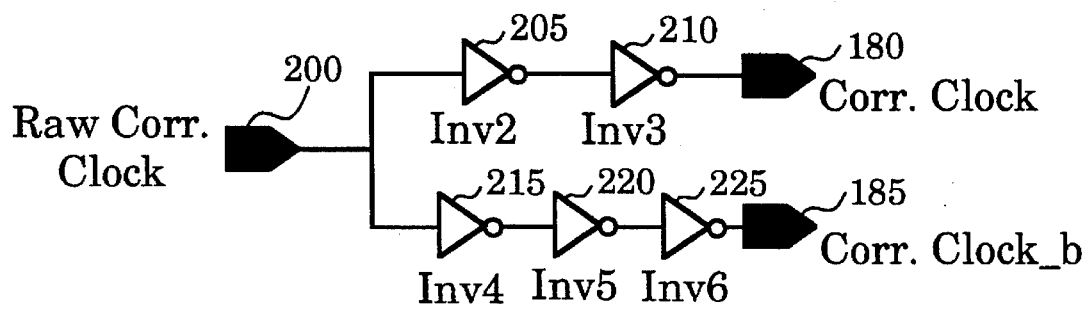

In an alternate embodiment, the circuit generates a single clock output and a subcircuit coupled between the clock output and the inputs to the duty cycle error measurement circuit. An illustration of one embodiment of the sub-circuit that generates the corrected clock signal and 180 degree out-of-phase version of the corrected clock signal is shown in FIG. 3b. Referring to FIG. 3b, the corrected clock signal 200 is input to a plurality of inverters 205, 210, 215, 220 and 225 to generate the corrected clock signal 180 and out of phase signal 185. The inverters 205, 210, 215, 220, 225 form a low-skew phase splitter.

Figure 4:
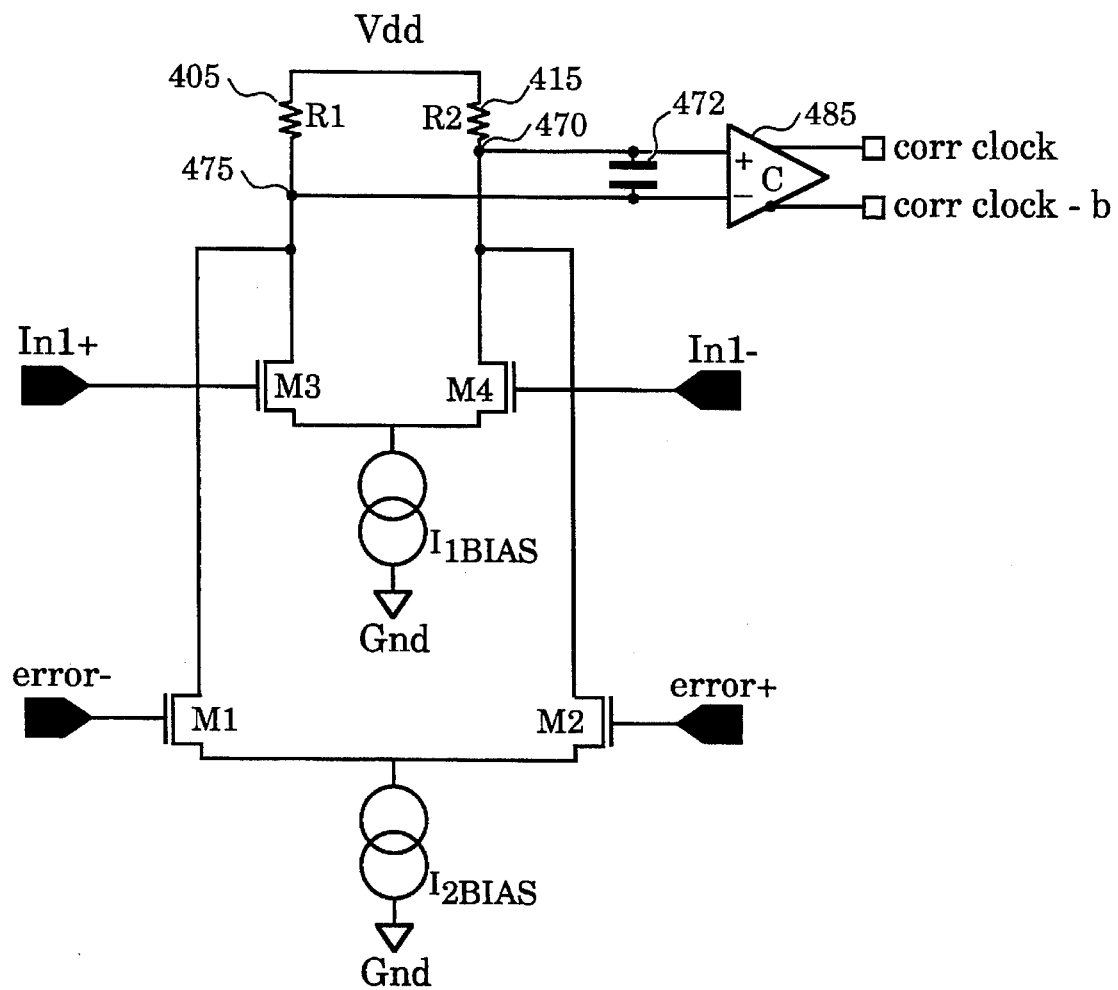
FIG. 4 illustrates an alternate embodiment of the the duty cycle correcting amplifier of the present invention.

An alternate embodiment of the duty cycle correcting amplifier is shown in FIG. 4. The circuit is similar to the embodiment illustrated in FIG. 2 except that resistor loads are employed. The resistor loads may be implemented as resistors, NMOS or PMOS devices. Referring to FIG. 4, resistors 405, 415 provide a fixed load which functions to provide the clamping desired as well as functions to limit the rise and fall times of the signals at nodes 470, 475 in accordance with the RC time constant, where the resistance R is specified by the value of resistance and the capacitance C is specified by the parasitic capacitance of transistors utilized or an additional capacitance added to nodes 470, 475. In the embodiment represented by FIG. 2, the capacitive charging current is independent of values of VDD. However, in the present embodiment illustrated by FIG. 4, the capacitive charging current is dependent upon the value of VDD. The differential output signal generated at nodes 470, 475 is input to a comparator which functions to generate a square wave signal representative of the duty cycle corrected signal.

The invention has been described in conjunction with the preferred embodiment. It is evident that numerous alternatives, modifications, variations and uses will be apparent to those skilled in the art in light of the foregoing description.

What is claimed is:

1. An amplifier circuit with active duty cycle correction of an input signal to generate a corrected output signal, said amplifier comprising:

a first amplifier receiving an input representative of an uncorrected input signal and generating as output an uncorrected output signal;

a duty cycle measurement circuit which measures the corrected output signal and generates as an output a difference signal representative of the difference of the duty cycle of the corrected output signal and a predetermined duty cycle;

a second amplifier which receives as input the output of the duty cycle measurement circuit and generates a correction signal;

summing means for summing the correction signal and the uncorrected output signal to produce a summed signal;

an integrating capacitance which receives as input the summed signal and generates as output a slew limited voltage signal, said integrating capacitance causing the output to be slew limited for a portion of the input greater than the predetermined duty cycle, said slew limited voltage signal representative of the corrected output signal.

2. The amplifier as set forth in claim 1, further comprising a third amplifier which receives as input the slew limited voltage signal and generates as output a square waveform representative of the corrected output signal.

3. The amplifier as set forth in claim 1, further comprising a signal clamp means coupled to the integrating capacitance to clamp the slew limited voltage signal to a predetermined voltage.

4. The amplifier as set forth in claim 3, wherein said signal clamp means functions to clamp the output such that the slew limited voltage signal exhibits substantial slew limiting for a fraction of the input signal greater than the predetermined duty cycle.

5. The amplifier as set forth in claim 1, wherein said duty cycle measurement circuit further filters ripple from the corrected output signal.

6. The amplifier as set forth in claim 5, wherein said duty cycle measurement circuit filters ripple by adding extra poles to a transfer function of the duty cycle measurement circuit.

7. The amplifier as set forth in claim 1, wherein said first and second amplifiers comprise transconductance amplifiers.

8. The amplifier as set forth in claim 1, wherein said duty cycle error measurement circuit comprises a differential charge pump.

9. The amplifier circuit as set forth in claim 1, wherein said input signal is representative of a differential input signal.

10. The amplifier circuit as set forth in claim 1, wherein said output of the first amplifier comprises a differential output signal.

11. The amplifier circuit as set forth in claim 2, further comprising an inverter coupled to receive the output of the third amplifier and output the corrected output signal.

12. An amplifier with active duty cycle correction of an input signal to generate a corrected output signal, said amplifier circuit comprising:

a first amplifier means receiving a first and second input representative of a differential uncorrected input signal and generating as output a differential output current;

a duty cycle measurement means which measures the corrected output signal and generates as an output a differential signal representative of the difference of the duty cycle of the corrected output signal and a predetermined duty cycle;

a second amplifier means which receives as input the output of the duty cycle measurement means and generates a correction current;

summing means for summing the correction current and the differential output current to produce differential summed current signals;

an integrating capacitance means which receives as input the summed differential current and generates as output a slew limited differential voltage signal, said integrating capacitance means causing the output to be slew limited for a portion of the input greater than the predetermined duty cycle, said slew limited differential voltage signal representative of the corrected output signal.

13. The amplifier as set forth in claim 12, further comprising a signal clamping means coupled to the integrating capacitance means to clamp the slew limited differential voltage signal to a predetermined voltage.

14. The amplifier as set forth in claim 13, wherein said signal clamping means functions to clamp the output such that the slew limited voltage signal exhibits substantial slew limiting for a fraction of the input signal greater than the predetermined duty cycle.

15. The amplifier as set forth in claim 13, wherein said duty cycle measurement means further filters ripple from the corrected output signal.

16. The amplifier as set forth in claim 15, wherein said duty cycle measurement means filters ripple by adding extra poles to a transfer function of the duty cycle measurement means.

17. A method for actively correcting the duty cycle of an uncorrected input signal to generate a corrected output signal, said method comprising the steps of:

measuring the duty cycle of the corrected output signal and generating as an output a signal representative of the difference of the duty cycle of the corrected output signal and a predetermined duty cycle;

generating a correction signal from the signal representative of the difference of the duty cycle of the corrected output signal and a predetermined duty cycle;

generating an uncorrected output signal from said uncorrected input signal summing the correction signal and uncorrected output signal to produce a summed signal;

generating a slew limited voltage signal from the summed signal, said slew limited voltage signal being slew limited for a portion of the uncorrected input signal greater than the predetermined duty cycle, said slew limited voltage signal representative of the corrected output signal.

18. The method as set forth in claim 17, further comprising the step of generating as output a square waveform representative of the corrected output signal from the slew limited voltage signal.

19. The method as set forth in claim 17, further comprising the step of clamping the slew limited voltage signal to a predetermined voltage.

20. The method as set forth in claim 17 wherein the slew limited voltage signal exhibits substantial slew limiting for a fraction of the input signal greater than the predetermined duty cycle.

21. The method as set forth in claim 17, further comprising the step of filtering ripple from the corrected output signal prior to measuring the duty cycle of the corrected output signal.

* * * * *